(12) United States Patent
Schauerte et al.

(10) Patent No.: US 7,053,352 B2
(45) Date of Patent: May 30, 2006

(54) SELF TESTING CMOS IMAGER CHIP

(75) Inventors: Frank J. Schauerte, Berkley, MI (US);
Brian T. Murray, Novi, MI (US);
John R. Troxell, Sterling Heights, MI (US); Charles N. Stevenson, Stow, MA (US)

(73) Assignee: Delphi Technologies, Inc., Troy, MI (US)

( * ) Notice: Subject to any disclaimer, the term of this patent is extended or adjusted under 35 U.S.C. 154(b) by 149 days.

(21) Appl. No.: 10/784,490

(22) Filed: Feb. 23, 2004

(65) Prior Publication Data

US 2005/0184218 A1    Aug. 25, 2005

(51) Int. Cl.
*H01L 27/00* (2006.01)

(52) U.S. Cl. .............................. 250/208.1; 250/214 R; 250/214 C; 348/302; 257/290

(58) Field of Classification Search ............. 250/208.1, 250/214 R, 214 C; 348/302–304, 306, 308, 348/313–314; 257/222–223, 225, 257–258, 257/290–291
See application file for complete search history.

(56) References Cited

U.S. PATENT DOCUMENTS 6,797,933 B1 *  9/2004  Mendis et al. ........... 250/208.1

* cited by examiner

*Primary Examiner*—Stephone B. Allen
*Assistant Examiner*—Patrick J. Lee
(74) *Attorney, Agent, or Firm*—Stefan V. Chmielewski

(57) ABSTRACT

A self testing CMOS imager chip includes a controller which outputs a sewer signal, a dump signal, a collect signal, and a read signal, and a pixel array connected to the controller including a plurality of pixels arranged in an array of rows and columns, each pixel having a collect gate disposed adjacent a collect well for receiving a charge in response to application of the collect signal to the collect gate, a sewer for injecting a charge into the collect well in response to the concurrent application of the sewer signal to the sewer and the collect signal to the collect well, a read gate disposed adjacent a read well for receiving the injected charge from the collect well in response to application of the read signal to the read gate and the absence of the collect signal at the collect gate, and a transistor having a gate coupled to the read well, a source for receiving the read signal, and a drain coupled to an output node connected to the controller. The read signal is modulated by the injected charge at the gate of the transistor, thereby generating an injected output signal at the output node representing the injected charge. The controller, through read-out circuitry, comparing the injected output signal to an expected output signal to test the operation of each pixel of the array.

33 Claims, 5 Drawing Sheets

TABLE 1

| Open Circuit Faults | Effect at Output |
|---|---|
| VCC Open | Array cannot be changed |
| DUMP Open | Array cannot be changed |
| COLLECT Open | Cannot write a 0 |
| READ Open | Stuck at 0 |
| Power to READ Open | Stuck at 0 |
| FLOAT to T1 Open | Stuck at 0 |
| T1 source Open | Stuck at 0 |
| T2 gate Open | Stuck at 0 |
| T2 source Open | Stuck at 0 |
| T2 drain Open | Stuck at 0 |
|  |  |

TABLE 2

| Short Circuit Faults | Effect at Output |
|---|---|
| READ shorted to FLOAT | Always 1 |
| READ shorted to COLLECT | No 0 |
| DUMP shorted to COLLECT | Always 0 |
| DUMP shorted to Active | Always 0 |
| FLOAT shorted to substrate | Always 1 |
| COLLECT shorted to substrate | Always 1 |
| DUMP shorted to substrate | Settles to 0 |
| READ shorted to substrate | Always 1 |
| VCC(at n+) shorted to substrate | Always 1 |
| T1 gate to drain shorted | Always 1 |
| T1 gate to source shorted | Always 0 |
| T1 gate to channel shorted | Always 1 |
| T1 source to drain shorted | Always 1 |
| T2 gate to drain shorted | Column read affected-no pixels readable |
| T2 gate to source shorted | Always 1 |
| T2 gate to channel shorted | Always 1 |
| T2 source to drain shorted | Column read affected-no pixels readable |
|  |  |

FIG. 5

SELF TESTING CMOS IMAGER CHIP

TECHNICAL FIELD

The present invention relates generally to photo-sensitive imagers, and more particularly, to a photo-capacitive imager chip with an electrical charge injection feature for self testing the imager chip.

BACKGROUND OF THE INVENTION

Photo-sensitive imagers collect charge due to incident light to sense the presence or absence of objects which affect the amount of incident light available to the imager. In the automotive industry, for example, imagers are used as sensors in lane tracking systems, edge-of-road detection systems, near-obstacle-avoidance detection systems, crash alert systems and passenger position sensing systems. Such safety critical applications require imagers with high reliability. Accordingly, conventional imagers, which are typically photo-diode imagers, are tested at the manufacturer using precision equipment to inject a known quantity of light and compare the imager output to the expected output resulting from the known quantity of light. Such test equipment is generally quite sophisticated and correspondingly expensive. Additionally, operational testing at the manufacturer, while beneficial for a variety of reasons, does nothing to address the need for monitoring imager operation and detecting in-field failures or changes in imager performance.

SUMMARY OF THE INVENTION

The present invention provides a self testing CMOS imager chip generally including a pixel array and associated control and read electronics. The pixel array includes a plurality of pixels arranged in rows and columns. During normal light collection, the pixels collect an image charge due to incident light. The control electronics capture the image by reading the image charge of each pixel, one row at a time. After the pixels of a first row are read, the pixels of an adjacent row are read and the previously read row of pixels is returned to a normal light collection mode. The control electronics read the pixels a row at a time in this rolling fashion. The entire pixel array is read many times each second.

Each pixel includes a collect gate, a read gate, and a dump gate. The collect gate, when enabled, collects charge due to the incident light. This charge is transferred to the read gate, and to the control electronics by energizing the gates according to a predetermined sequence referred to as the read cycle. After the control electronics read the image charge of the pixel, the dump gate is energized to move the charge to a sewer, thereby erasing the image charge. The sewer is defined as a heavily doped implantation or diffusion region connected to the pixel, which is normally used to drain off charge from the pixel after the readout sequence. In this application, this region is also used as a source of charge to be injected into the pixel without using a light source. The pixel is read again in the absence of light to measure the background charge, and the background charge is compared by the control electronics to the image charge according to a conventional correlated double sampling technique in order to reduce fixed pattern noise.

Upon power-up, the control electronics manipulate the dump gate and the sewer just prior to the read cycle to electrically inject a known injected charge into the collect well associated with the collect gate. The read cycle transfers the injected charge to the read gate and off-chip electronics in the manner described above. The injected charge is dumped and the background charge is read according to the correlated double sampling technique described above. Accordingly, the control electronics may inject a test pattern on a pixel-by-pixel basis and read out the pattern from the pixel array to test the functionality of each pixel of the array. As such, the need for expensive, light injecting and measuring test equipment is eliminated. Moreover, this self test feature enhances the operation of the imager by permitting power-up reporting of pixel array failures during operation in the field.

These and other features of the present invention will become more apparent and the invention will be better understood upon consideration of the following description and the accompanying drawings.

BRIEF DESCRIPTION OF THE DRAWINGS

FIG. 5 depicts tables of fault diagnostics.

DESCRIPTION OF THE EMBODIMENTS OF THE INVENTION

The embodiments of the invention described herein are not intended to be exhaustive or to limit the invention to the precise forms disclosed. Rather, the embodiments selected for description have been chosen to enable one skilled in the art to practice the invention.

Figure 1:
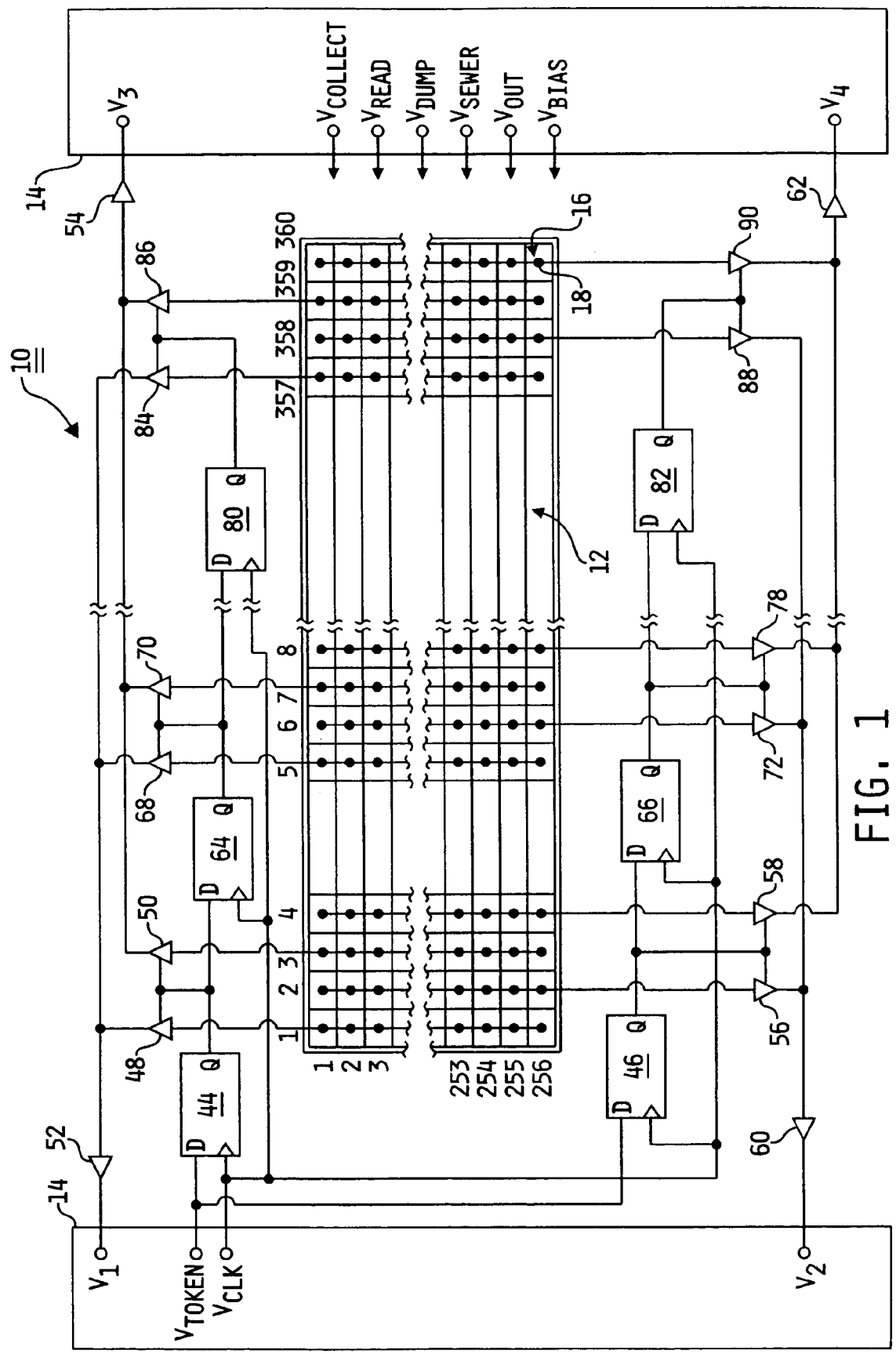
FIG. 1 is a schematic diagram of an imager according to the present invention.

Referring now to FIG. 1, imager 10 generally includes a pixel array 12, a controller 14 for inputting control signals to pixel array 12 and receiving output signals from the read-out electronics (the remaining electronics shown in FIG. 1). Pixel array 12 is arranged in 226 rows of 360 pixels 16 each. Each pixel 16 includes an output node 18. As shown in FIG. 1, the output nodes 18 of pixels 16 in each of the 360 columns are connected together and to the read-out electronics as will be further described below. It should be understood that the size of array 12 (i.e., the number of rows and columns) is irrelevant in terms of implementing the teachings of the present invention.

Figure 2:
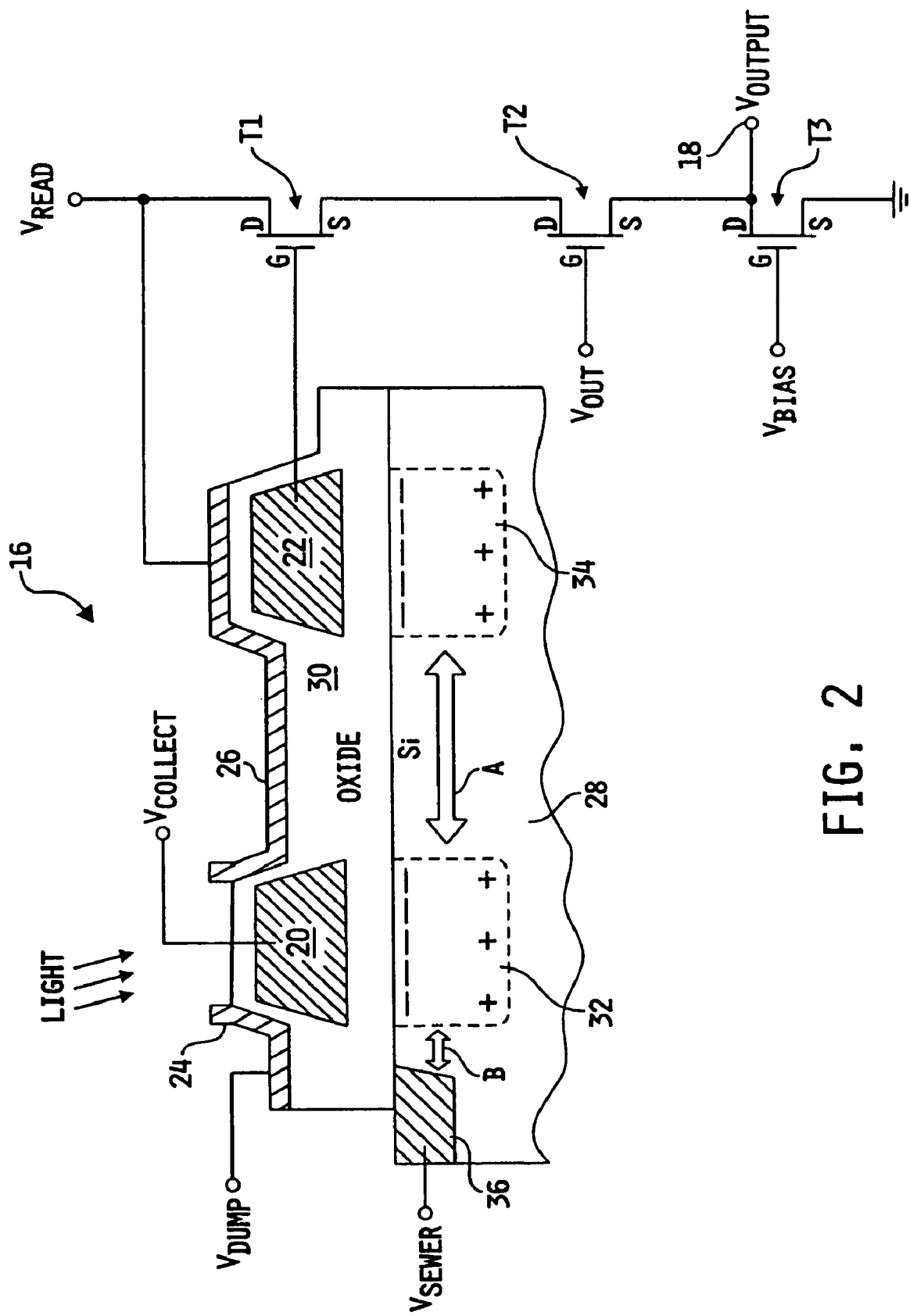
FIG. 2 is a simplified, cross-sectional view of a pixel according to the present invention shown with electronics present on the pixel array.

FIG. 2 is a cross-sectional representation of the layers of a single pixel 16 fabricated using a 1.2 micron minimum feature automotive CMOS process. It is to be understood that FIG. 2 represents one particular embodiment of the present invention, and smaller or larger feature size processes could be used to fabricate the illustrated devices. Pixel 16 includes a polysilicon collect gate 20 which forms an NMOS photo-capacitor (the collect gate 20), another first layer polysilicon gate referred to as the float gate 22, and second layer polysilicon gates including the dump gate 24 and the read gate 26. As shown in FIG. 2, collect gate 20 and float gate 22 are separated from dump gate 24 and read gate 26, as well as from the silicon substrate 28 by oxide 30 according to practices well-known in the art. As will be further described below, under certain circumstances, a depletion region which contains the inversion layer and together are referred to as the collect well 32 is formed under collect gate 20 (creating an NMOS photo-capacitor with collect gate 20) and a depletion region which contains the inversion layer and together are referred to as the read well 34 is formed under floating gate 22 (creating an NMOS photo-capacitor with floating gate 22). Additionally, a highly doped portion of silicon 28 referred to as the sewer 36 is included in silicon 28 of pixel 16.

Dump gate 24 is connected to a pad (not shown) on pixel array 12 which is connected to controller 14 to receive control signal $V_{DUMP}$. Similarly, collect gate 20, read gate 26, and sewer 36 are connected to chip pads (not shown) which receive control signals $V_{COLLECT}$, $V_{READ}$ and $V_{SEWER}$, respectively, from controller 14. Each pixel of array 12 has associated with it transistors T1, T2, and each column of array 12 has associated with it transistor T3 as shown in FIG. 2. Floating gate 22 of each pixel 16 in each column is connected to the gate of transistor T1 associated with that column. Control signal $V_{READ}$, supplied to read gate 26 (which spans an entire row of pixels 16, thereby ensuring that $V_{READ}$ is applied simultaneously to all 360 pixels within a particular row), is connected to the drain of transistor T1. The source of transistor T1 is connected to the drain of transistor T2. The source of transistor T2 is connected to the drain of transistor T3, which is connected to output node 18 of pixel 16. The signal provided at output node 18 is $V_{OUTPUT}$ which may be any of the image charge, the background charge, or the injected charge as described below. The source of transistor T3 is connected to ground. The gates of transistors T2 and T3 are connected to pads (not shown) on array 12 which receive control signals $V_{OUT}$ and $V_{BIAS}$, respectively, from controller 14.

When power is applied to imager chip 10, all rows of array 12 begin to integrate charge due to incident light which passes through the collection gate 20 and is absorbed in the depletion region or nearby it, the photons of which pass through the transparent polysilicon collect gate 20, which is at a high positive voltage, and oxide 30 to bombard silicon 28 below. Further details relating to the operation of the collection gate 20 are given in U.S. Pat. No. 6,180,937, the disclosure of which is incorporated herein by reference. In any case, the photons break up in the depletion region, referred to as the collect well 32, into electron-hole pairs. The holes are repelled by the positive voltage of collect gate 20 and are pushed away to silicon 28. The negatively charged electrons are collected in collect well 32 and constitute the collected charge or image charge which is proportional to the intensity of the incident light.

A photo-capacitor is formed by collect gate 20 (when positively charged) and collect well 32 which remains negatively charged so long as $V_{COLLECT}$ is applied. When the image charge of pixel 16 in a particular row is to be read, $V_{READ}$ is applied to read gate 26. When read gate 26 is energized, a depletion region under gate 26 is formed. Specifically, a depletion region also forms under floating gate 22, referred to as the read well 34. $V_{COLLECT}$ is then removed from collect gate 20 to collapse collect well 32. The charge present in collect well 32 then migrates through silicon 28 to read well 34 as indicated by arrow A.

$V_{READ}$ is held high during the reading of the entire active row of pixels 16 and each of the image charges stored in the 360 pixels 16 of the row are converted to voltage values read off chip. Specifically, the negative charge in read well 34 creates a positive charge in floating gate 22 which is connected to the gate of transistor T1. The value of $V_{READ}$, present at the drain of transistor T1, is modulated by the image charge transferred to floating gate 22. Accordingly, the signal represented by the photoinduced charge collected in the collect well 32, which is proportional to the quantity of light absorbed, is transferred by read gate 26 to charge well 34 and induces a voltage on floating gate 22 to modulate the conductivity of transistor T1. This change in voltage on the gate of T1 modulates the voltage on the source of T1 and consequently the drain of T2. Controller 14 applies $V_{OUT}$ and $V_{BIAS}$ to the gates of transistors T2 and T3, respectively. Accordingly, both transistors conduct and the image charge at the source of transistor T1 is present at the drain of transistor T3 and at node 18 of pixel 16 as $V_{OUTPUT}$. $V_{OUTPUT}$ is transferred to controller 14 through the read-out circuitry of FIG. 1 as will be further described below.

After the image charge is transferred to $V_{OUTPUT}$ in the manner described above, the charge previously present in collect well 32 and readout well 34 must be eliminated to avoid the influence of one integration cycle on the next. The control signal $V_{DUMP}$ provides this "erasing" function. Specifically, $V_{COLLECT}$ is turned on and $V_{READ}$ is turned off so that any charge still present in read well 34 moves through silicon 28 to collect well 32 along path A. $V_{DUMP}$ is then applied to dump gate 24 and $V_{COLLECT}$ is removed from collect gate 20 so that the charge in collect well 32 moves through the path indicated by arrow B to sewer 36. Sewer 36 is powered by $V_{SEWER}$ (the equivalent of VCC or analog power to pixel array 12) which is a positive voltage such that the charge present in collect well 32 is quickly swept into sewer 36.

After the image charge is cleared from read well 34 and collect well 32, the read cycle described above is repeated to accomplish a correlated double sampling cycle. Since each pixel 16 has a slightly different response to light as a result of the manufacturing process and the materials used, the background charge in collect well 32 must be compared to the image charge previously read to determine the actual component of the image charge due to the incident light. Once the background charge is subtracted from the image charge, the true signal due to the incident light is established. To read the background charge, $V_{COLLECT}$ is turned off and $V_{READ}$ is turned on such that the background charge in collect well 32 is transferred to read well 34 and ultimately to floating gate 22. This background charge modulates transistor T1, and the modulated $V_{READ}$ signal is transferred through transistors T2 and T3 in the manner described above to be read as $V_{OUTPUT}$ at node 18 of pixel 16.

The self test feature of the present invention is made possible by driving the voltage of $V_{SEWER}$ negative enough to inject charge from the sewer to the depletion region just prior to the read cycle described above. Specifically, $V_{DUMP}$ is applied to dump gate 24 just prior to the read cycle. Then, $V_{SEWER}$ is driven negative for a short period of time to inject charge from sewer 36 (the injected charge). $V_{COLLECT}$ is high just before the read cycle, thereby energizing collect gate 20. As such, the injected charge in sewer 36 is transferred through silicon 28 along the path indicated by arrow B to collect well 32. This predetermined injected charge is then read in a manner identical to the reading of photogenerated charge by applying $V_{READ}$ to read gate 26 and removing $V_{COLLECT}$ from collect gate 20 such that the injected charge is transferred through silicon 28 along the path indicated by arrow A to read well 34. The injected charge is transferred, as described above, to floating well 22 to modulate transistor T1. The modulated $V_{READ}$ is then transferred through transistors T2 and T3 to output node 18 as $V_{OUTPUT}$. The injected $V_{OUTPUT}$ is read by the read-out circuitry of FIG. 1 as further described below, and a dump cycle is initiated to clear the injected charge from collect well 32. The background charge is then transferred from collect well 32 to read well 34, floating gate 22, and transistors T1, T2, and T3 as described above to accomplish the conventional correlated double sampling method.

Figure 3:
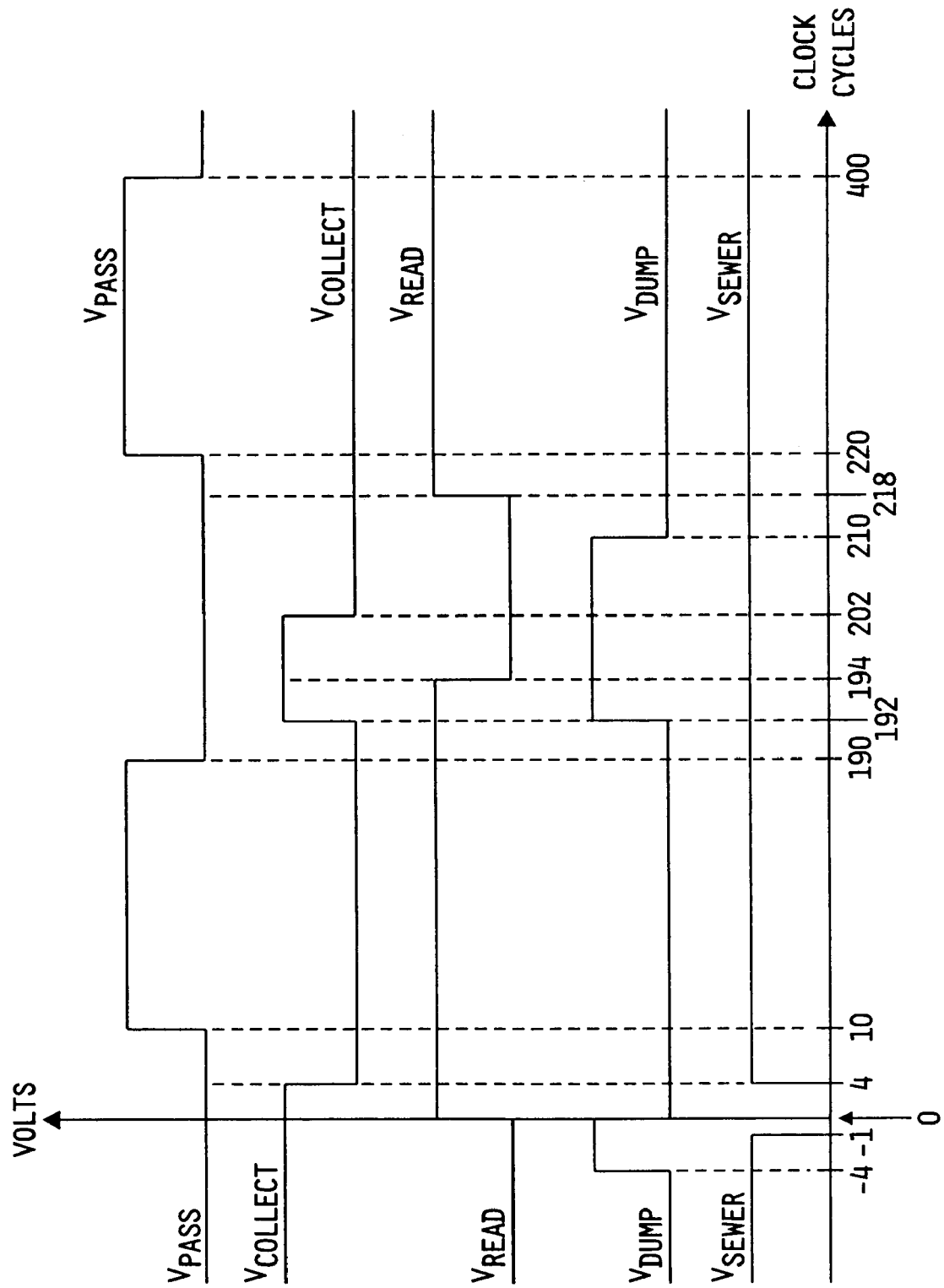
FIG. 3 is a timing diagram illustrating the sequence of wave forms used to test and read the pixel of FIG. 2.

A typical correlated double sampling read cycle is illustrated in the timing diagram of FIG. 3, as is the sequencing of control signals to pixel 16 to accomplish the self test procedure described above. The Y axis of FIG. 3 is an arbitrary voltage axis which indicates any of a variety of minimum and maximum voltages for the control signals $V_{PASS}$, $V_{COLLECT}$, $V_{READ}$, $V_{DUMP}$, and $V_{SEWER}$. The X axis is the time axis, showing increments of clock cycles used by the read-out circuitry of FIG. 1 to transfer $V_{OUTPUT}$ from output nodes 18 of pixels 16 to controller 14.

A typical read cycle wherein an image charge is previously collected in collect well 32 due to incident light begins at clock cycle 0. Accordingly, $V_{DUMP}$ is transitioned low and $V_{READ}$ is transitioned high at clock cycle 0. At clock cycle 4, $V_{COLLECT}$ is transitioned low so that the image charge accumulated in collect well 32 is transferred through path A of silicon 28 to read well 34. The actual polling of $V_{OUTPUT}$ from nodes 18 of pixels 16 along the row currently being read begins at clock cycle 10 as indicated by $V_{PASS}$. Between clock cycle 10 and clock cycle 190, each of the 360 pixels 16 in the row presently being read are polled, and $V_{OUTPUT}$ from each node 18 of pixels 16 is transferred through the read-out circuitry of FIG. 1 to controller 14 as further described below. After the $V_{OUTPUT}$ signals are transferred to controller 14, both $V_{COLLECT}$ and $V_{DUMP}$ are transitioned high at clock cycle 192. $V_{READ}$ is transitioned low at clock cycle 194 so that any charge still present in read well 34 is moved through path A to collect well 32 and path B to sewer 36 between clock cycles 194 and 202. Since $V_{SEWER}$ is high after clock cycle 202, any charge present in collect well 32 is transferred through path B to sewer 36 during clock cycles 202 through 210. At clock cycle 210, $V_{DUMP}$ transitions low. At clock cycle 218, $V_{READ}$ transitions high to transfer whatever charge is still present in collect well 32 through path A of silicon 28 to read well 34 and floating gate 22. At clock cycle 220, $V_{OUT}$ and $V_{BIAS}$ are applied to transistors T2 and T3, respectively, and each pixel 16 in the row presently being read is polled between clock cycles 220 and 400 as indicated by $V_{PASS}$.

The injection of a charge into collect well 32 for self test purposes is also illustrated by the timing diagram of FIG. 3. During a self test procedure, $V_{DUMP}$ is transitioned high at clock cycle −4 just prior to the read cycle beginning at clock cycle 0. It should be understood that the timing of the application of the various control signals is a matter of design choice. The relative sequence of the control signals shown FIG. 3 provides the self test feature of the present invention. In this embodiment, after $V_{DUMP}$ is transitioned high at clock cycle −4, $V_{SEWER}$ is pulsed negative between clock cycles −1 and 4. Accordingly, negative voltage is applied to sewer 36 while both $V_{DUMP}$ and $V_{COLLECT}$ are high (between clock cycle −1 and clock cycle 0). This transfers a known electrical voltage from sewer 36 through path B to collect well 32. As described above, at clock cycle 0, $V_{READ}$ is transitioned high, and at clock cycle 4, $V_{COLLECT}$ is transitioned low to transfer the charge from collect well 32 through path A of silicon 28 to read well 34. The remainder of the read cycle is as described above. Accordingly, the injected charge may be induced electrically into collect well 32 from sewer 36 as a result of a negative voltage applied as $V_{SEWER}$, and ultimately read by the read-out circuitry of FIG. 1 to indicate the proper functioning of pixel 16. The same correlated double sampling procedure is followed during the self test cycle as was carried out during the read cycle of an image charge due to incident light as described above.

Figure 4:
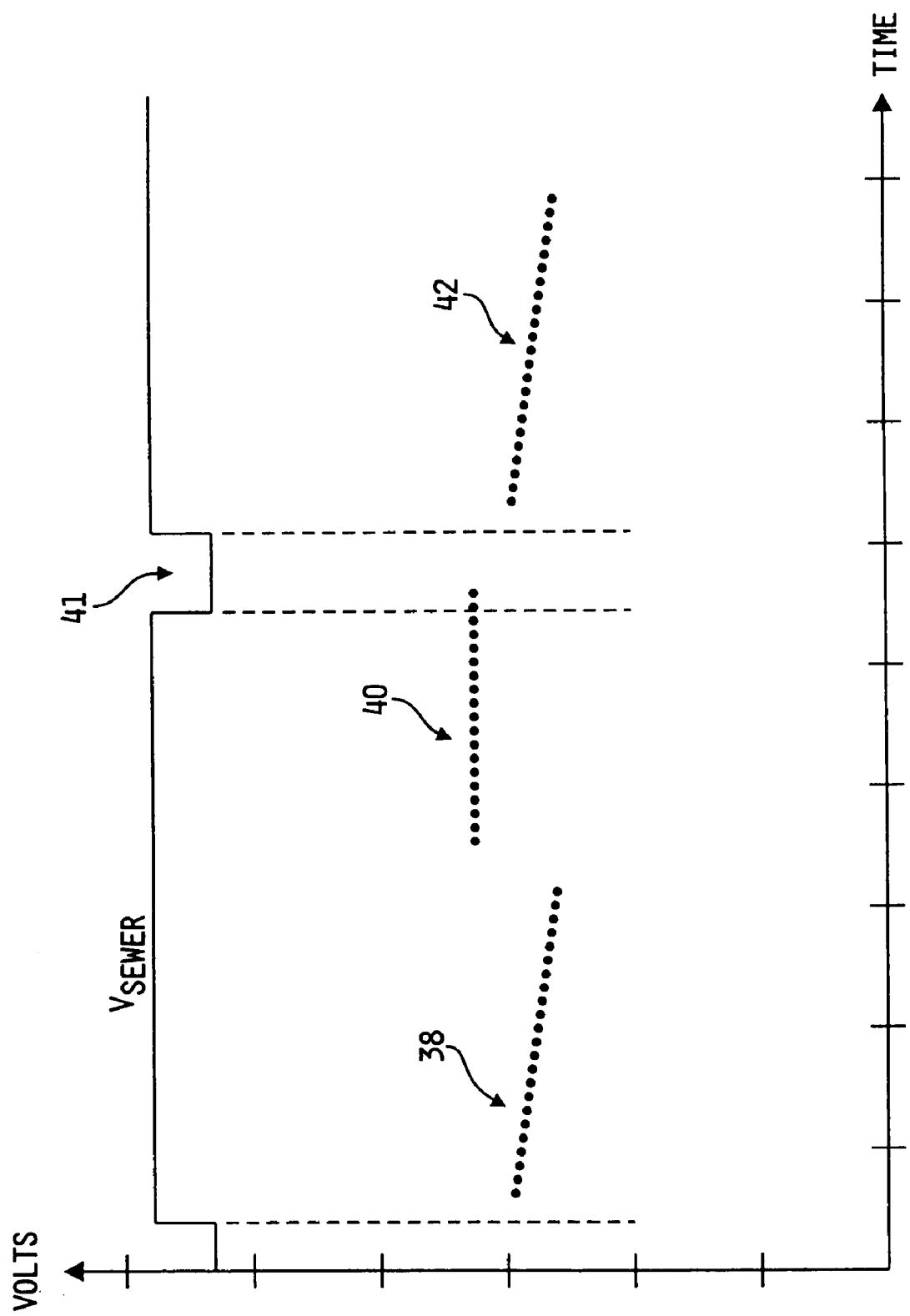
FIG. 4 is a plot of the imager output during a self test cycle.

The $V_{OUTPUT}$ signal from each of the 360 pixels 16 of a row of array 12 during a self test cycle is illustrated in FIG. 4. As shown, $V_{SEWER}$ initially transitions low to inject charge into collect well 32. Trace 38 illustrates the readout of $V_{OUTPUT}$ for each of the 360 pixels 16 in the row presently being read. As shown, each of the 360 pixels 16 outputs a $V_{OUTPUT}$ signal which, relative to one another, creates a slightly negative slope. The series of dots of trace 40 illustrate the $V_{OUTPUT}$ signal read from each of pixels 16 of the row presently being read after the injected charge from sewer 36 has been dumped (the erased charge) according to the procedure described above. A second self-test cycle is initiated by the low pulse 41 of $V_{SEWER}$ as indicated in FIG. 4. As shown, the trace indicated by reference numeral 42 exhibits the same slightly negative slope illustrated by the plurality of $V_{OUTPUTS}$ indicated by reference numeral 38.

Referring again to FIG. 1, the $V_{OUTPUT}$ signals from nodes 18 of pixels 16 of the row of pixel array 12 presently being read are transferred to controller 14 through the read-out circuitry as described below. The row read is initiated by applying $V_{TOKEN}$ to the D inputs of flip-flops 44, 46. When the $V_{CLOCK}$ signal from controller 14 transitions from high to low, the Q outputs of flip-flops 44, 46 transition high. The Q output from flip-flop 44 enables buffers 48, 50 which pass the $V_{OUTPUT}$ signal from nodes 18 of pixels 1 and 3 of row 1 to buffers 52, 54, respectively. These $V_{OUTPUT}$ signals are then transferred through buffers 52, 54 to nodes V1, V3 of controller 14, respectively. Simultaneously, the Q output of flip-flop 46 enables buffers 56, 58 to transfer the $V_{OUTPUT}$ signals from nodes 18 of pixels 2 and 4 of row 1 to buffers 60, 62, respectively. The $V_{OUTPUTS}$ from these even pixels 16 are transferred through buffers 60, 62 to nodes V2, V4 of controller 14, respectively. As such, $V_{OUTPUTS}$ from four pixels 16 of the row presently being read are transferred to controller 14 for processing as a result of the first clock pulse.

The Q outputs of flip-flops 44, 46 are connected to the D inputs of flip-flops 64, 66 which are associated with the next four columns of pixels 16 to be read from the row of pixel array 12 currently being polled. During the next transition of $V_{CLOCK}$, flip-flops 64, 66 produce a signal on their Q outputs to enable buffers 68, 70, and 72, 78, respectively. When buffers 68, 70 are enabled by flip-flop 64, the buffers transfer the output signals from the fifth and seventh pixels 16 of array 12 to buffers 52, 54, respectively. These buffers pass the $V_{OUTPUT}$ signals from the fifth and seventh pixels 16 to nodes V1, V3 of controller 14, respectively. Similarly, when the Q output of flip-flop 66 enables buffers 72, 78, the $V_{OUTPUT}$ signals of the sixth and eighth pixels 16 of the row currently being read are transferred to buffers 60, 62 and nodes V2, V4 of controller 14, respectively. The $V_{OUTPUT}$ signals of the row of pixels 16 currently being read are transferred to controller 14 in the manner described above across the entire row.

The last clock pulse to flip-flops 80, 82 facilitate the read-out of the final four pixels 16 of the row currently being read. Specifically, the Q output of flip-flop 80 enables buffers 84, 86 which pass the $V_{OUTPUT}$ of pixels 357 and 359, respectively, to buffers 52, 54, respectively. Buffers 52, 54 transfer these $V_{OUTPUT}$ signals to nodes V1, V3 of controller 14, respectively. Likewise, the clock pulse to flip-flop 82 enables buffers 88, 90 which pass the $V_{OUTPUT}$ signals from pixels 358 and 360 to buffers 60, 62, respectively. Buffers 60, 62 pass these signals to nodes V2, V4 of controller 14, respectively. As should be apparent from the above, 90 $V_{CLOCK}$ transitions are required to read the 360 pixels 16 of the row of pixels 16 of array 12 currently being read.

At power-up, or at some other appropriate time during operation of imager 12, controller 14 provides appropriate signals to dump gate 24, sewer 36, collect gate 20, and read gate 26 to inject a charge to each pixel 16 in array 12. Controller 14 then carries out the above-described correlated double sampling read process to verify that each pixel 16 is operational by reading the injected charge. Considering the entire pixel array 12, individual charges could be injected to pixels 16 to create a checkerboard pattern wherein every other pixel 16 is initially injected with a test charge during a first frame read, and the remaining pixels are injected during the second frame read. Accordingly, the operation of each pixel 16 of array 12 is verified through this self test procedure without the need for precision light sources or other test equipment.

FIG. 5 is a tabulation of cause-and-effect relationships which may be detected through the self test procedure described above. Table 1 illustrates the expected $V_{OUTPUT}$ of pixels 16 when open circuit faults are present at various locations in pixel 16. Table 2 illustrates the expected $V_{OUTPUT}$ of pixels 16 when short circuit faults are present at various locations of pixel 16.

Although the present invention has been shown and described in detail, the same is to be taken by way of example only and not by way of limitation. Numerous changes can be made to the embodiments described above without departing from the scope of the invention.

The invention claimed is:

1. A self testing imager including:
a controller outputting a sewer signal and a read signal;
a pixel array connected to the controller including a plurality of pixels, each pixel including a sewer for injecting a charge into the pixel in response to the sewer signal; the pixel outputting an injected output signal representing the injected charge in response to the read signal, the controller comparing the injected output signal to an expected output signal to test the operation of the pixel; and
a read-out circuit having a plurality of buffers enabled to transfer the injected output signal from the pixels to the controller.

2. A self testing imager including:
a controller outputting a sewer signal and a read signal; and
a pixel array connected to the controller including a plurality of pixels, each pixel including a sewer for injecting a charge into the pixel in response to the sewer signal, and an output node;
wherein the pixel outputs an injected output signal representing the injected charge in response to the read signal, the controller comparing the injected output signal to an expected output signal to test the operation of the pixel, each pixel further including a collect gate for receiving a collect signal from the controller, and a collect well associated with the collect gate for receiving the injected charge from the sewer in response to the collect signal.

3. The imager of claim 1, each pixel further including a read gate for receiving the read signal, and a read well associated with the read gate for receiving the injected charge from the sewer in response to the read signal.

4. A self testing imager including:
a controller outputting a sewer signal and a read signal; and
a pixel array connected to the controller including a plurality of pixels, each pixel including:
a sewer for injecting a charge into the pixel in response to the sewer signal,
an output node;
a read gate for receiving the read signal;
a read well associated with the read gate for receiving the injected charge from the sewer in response to the read signal; and
a transistor having:
a gate coupled to the read well;
a drain connected to the controller to receive the read signal; and
a source coupled to the output node, the read signal being modulated by the injected charge at the gate of the transistor to produce the injected output signal;
wherein the pixel outputs an injected output signal representing the injected charge in response to the read signal, the controller comparing the injected output signal to an expected output signal to test the operation of the pixel.

5. A self testing imager including:
a controller outputting a sewer signal and a read signal; and
a pixel array connected to the controller including a plurality of pixels, each pixel including:
a sewer for injecting a charge into the pixel in response to the sewer signal,
an output node; and
a dump gate for receiving a dump signal from the controller, the injected charge being dumped to the sewer in response to the dump signal and removal of the read signal and the sewer signal, thereby leaving a background charge;
wherein the pixel outputs an injected output signal representing the injected charge in response to the read signal, the controller comparing the injected output signal to an expected output signal to test the operation of the pixel.

6. The imager of claim 5 wherein the pixel outputs the background signal representing the background charge in response to the read signal, the controller comparing the injected output signal to the background output signal as part of a correlated double sampling procedure.

7. A self testing imager including:
a controller outputting a sewer signal and a read signal;
a pixel array connected to the controller including a plurality of pixels, each pixel including a sewer for injecting a charge into the pixel in response to the sewer signal, and an output node, the pixel outputting an injected output signal representing the injected charge in response to the read signal, the controller comparing the injected output signal to an expected output signal to test the operation of the pixel; and
a read-out circuit having a plurality of flip-flops and a plurality of buffers enabled by the flip-flops to transfer the injected output signal from the pixels to the controller.

8. The imager of claim 7 wherein the pixels are arranged in rows and columns in the pixel array, each buffer having an input connected to all of the pixels in a column of pixels associated with the buffer and an output connected to the controller, a first quantity of the plurality of buffers being connected to odd numbered columns and a second quantity of the plurality of buffers being connected to even numbered columns.

9. The imager of claim 8 wherein the plurality of flip-flops are sequentially enabled by a plurality of clock pulses from the controller, a first quantity of the plurality of flip-flops being connected to the first quantity of buffers, a second quantity of the plurality of flip-flops being connected to the second quantity of buffers.

10. The imager of claim 9 wherein each flip-flip enables a pair of buffers in response to a clock pulse, each clock pulse resulting in a transfer of the injected output signal from four adjacent columns of pixels to the controller.

11. A self testing imager including:
a controller; and
a plurality of pixels, each pixel including a collect well, a dump gate connected to the controller for receiving a dump signal, a sewer connected to the controller for receiving a sewer signal, the sewer injecting a predetermined charge into the collect well when the sewer signal and the dump signals are in a first state, and a read well coupled to the controller for receiving the injected charge from the collect well and providing the injected charge as an output signal through an output node to the controller,
wherein the controller compares the output signal to an expected signal related to the injected charge to test the operation of the pixel.

12. The imager of claim 11, each pixel further including a collect gate disposed adjacent the collect well and connected to the controller for receiving a collect signal, and a floating gate disposed adjacent the read well.

13. The imager of claim 12, each pixel further including a transistor having a gate connected to the floating gate, a drain connected to the controller for receiving the read signal, and a source coupled to the output node, the injected charge being transferred from the collect well to the read well to the floating gate when the collect signal is in a second state and the read signal is in a first state, the injected charge at the floating gate modulating the read signal conducted through the transistor, the output signal being equal to the modulated read signal.

14. The imager of claim 12 wherein the sewer, the collect well, and the read well are disposed in a silicon substrate, the collect gate and the floating gate being first layer polysilicon gates.

15. The imager of claim 12, each pixel further including a read gate connected to the controller for receiving a read signal, the floating gate being disposed between the read gate and the read well.

16. The imager of claim 15 wherein the dump gate and the read gate are second layer polysilicon gates.

17. The imager of claim 15 wherein the collect gate is disposed between the dump gate, the read gate, and the collect well, the dump gate and the read gate defining an opening adjacent the collect gate, the pixel receiving incident light through the opening, the light having photons which pass through the collect gate and deposit electrons in the collect well when the collect and dump signals are in a first state and the sewer signal is in a second state, thereby creating an image charge.

18. The imager of claim 17 wherein the image charge is transferred from the collect well to the read well when the collect signal is in a second state and the read signal is in a first state.

19. The imager of claim 17 wherein the collect well dumps the image signal to the sewer when the read and sewer signals are in the second state and the collect and dump signals are in the first state.

20. A self testing imager including:
a controller outputting a sewer signal, a collect signal, and a read signal; and
a pixel array connected to the controller including a plurality of pixels, each pixel including
a collect well for receiving a charge in response to application of the collect signal to the pixel,
a sewer for receiving the sewer signal, the sewer injecting a charge into the collect well in response to the concurrent application of the sewer signal and the collect signal to the pixel,
a read well for receiving the injected charge from the collect well in response to application of the read signal to the pixel and the absence of the collect signal, and
a transistor having a gate coupled to the read well, a drain for receiving the read signal, and a source coupled to an output node connected to the controller;
wherein the read signal is modulated by the injected charge at the transistor gate, thereby generating an injected output signal at the output node representing the injected charge, the controller comparing the injected output signal to an expected output signal to test the operation of the pixel.

21. The imager of claim 20, each pixel further including a substrate, the collect well, the sewer, and the read well being disposed in the substrate.

22. The imager of claim 20, each pixel further including a collect gate adjacent the collect well connected to the controller, the collect gate creating the collect well in response to application of the collect signal to the collect gate.

23. The imager of claim 22, each pixel further including a read gate adjacent the read well connected to the controller, the read gate creating the read well in response to application of the read signal to the read gate.

24. The imager of claim 23, each pixel further including a floating gate disposed between the read gate and the read well, the floating gate transferring the injected charge from the read well to the transistor gate in response to the read signal.

25. A self testing imager including:
a controller; and
a plurality of pixels connected to the controller, each pixel including
a collect well, a sewer, a dump gate, and a read well, each having a first and a second state,
the collect well collecting an image charge when in the first state,
the read well receiving the image charge when the collect well is in the second state and the read well is in the first state,
the collect well dumping the image charge to the sewer when the collect well is in the second state, and the dump gate and the sewer are each in the first state,
the sewer providing an injected charge to the collect well when the sewer is in the second state and the dump gate and the collect well are each in the first state,
the read well receiving the injected charge when in the collect well is in the second state and the read well is in the first state;
wherein the controller reads the image charge and the injected charge by applying a read signal to the pixel, and compares the injected charge to an expected charge to test the operation of the pixel.

26. A method of testing the operation of an imager having a plurality of pixels, the method including the steps of:
   outputting a first electrical signal to each pixel to inject a known charge into the pixel;
   outputting a second electrical signal to each pixel to read an output signal representing the injected charge;
   comparing the output signal to an expected output signal to test the operation of each pixel;
   outputting a third electrical signal to each pixel; and
   dumping the injected charge in response to the third signal and removal of the first and second electrical signals, thereby leaving a background charge.

27. The method of claim 26 wherein the step of outputting the third electrical signal to each pixel occurs while outputting the first signal to inject the known charge.

28. A method of testing the operation of an imager having a plurality of pixels, the method including the steps of:
   outputting a first electrical signal to each pixel to inject a known charge into the pixel;
   outputting a second electrical signal to each pixel to read an output signal representing the injected charge;
   comparing the output signal to an expected output signal to test the operation of each pixel;
   outputting a third electrical signal to each pixel while outputting the first signal to inject the known charge; and
   outputting a fourth electrical signal to each pixel while outputting the first and third signals to inject the known charge.

29. The method of claim 28 further including the step of removing the third signal while outputting the first and fourth signals to inject the known charge.

30. The method of claim 29 further including the step of removing the first and fourth signals while outputting the second signal to read the output signal.

31. A method of testing the operation of an imager having a plurality of pixels, the method including the steps of:
   outputting a first electrical signal to each pixel to inject a known charge into the pixel;
   outputting a second electrical signal to each pixel to read an output signal representing the injected charge; and
   comparing the output signal to an expected output signal to test the operation of each pixel;
   outputting a third electrical signal and a fourth electrical signal to each pixel to inject the known charge; and
   removing the second signal, then the fourth signal, and then the third signal to erase the injected charge.

32. The method of claim 31 further including the step of outputting another second signal to read a second output signal representing the erased injected charge.

33. The method of claim 26 wherein the plurality of pixels is arranged in an array having a plurality of rows of pixels and a plurality of columns of pixels, the read signal being concurrently provided to a row of pixels at a time, each row of the array sequentially receiving the read signal.

* * * * *